United States Patent [19]

Southard

[11] Patent Number: 4,518,858

[45] Date of Patent: May 21, 1985

[54] FIBER OPTIC TIME STANDARD

[75] Inventor: Gary Southard, Coral Springs, Fla.

[73] Assignee: Siemens Corporate Research & Support, Inc., Iselin, N.J.

[21] Appl. No.: 451,220

[22] Filed: Dec. 20, 1982

[51] Int. Cl.³ .............................................. G02B 5/14
[52] U.S. Cl. ................................. 250/227; 350/96.34; 307/310; 328/61; 368/108
[58] Field of Search ................... 250/227; 350/96.34, 350/96.1; 307/310; 455/610, 612; 368/108, 120; 328/59, 60, 61

[56] References Cited

U.S. PATENT DOCUMENTS 4,164,373 8/1979 Schuss et al. ...................... 250/227
4,406,003 9/1983 Eberly et al. ...................... 455/612

OTHER PUBLICATIONS

Cohen & Flemming, Effect of Temperature on Transmission in Lightguides, The Bell System Technical Journal, vol. 58, No. 4, Apr. 1979.

*Primary Examiner*—David C. Nelms
*Assistant Examiner*—Jim Gatto
*Attorney, Agent, or Firm*—Karl F. Milde, Jr.

[57] ABSTRACT

Apparatus for producing a time standard including a source of radiation, two fibers of different length to transmit the radiation, and means to produce a signal representative of the difference in propagation time through the fibers that is constant despite temperature changes.

9 Claims, 5 Drawing Figures

FIBER OPTIC TIME STANDARD

BACKGROUND OF THE INVENTION

This invention relates to the use of fiber optics to produce a time standard. Electrically produced light pulses can be transmitted by an optical fiber and then reconverted to an electrical impulse upon emerging from the fiber.

Presently, time standards are produced with voltage controlled crystal oscillators (VCXO), cesium clocks or rubidium clocks.

These existing methods of producing time standards have several disadvantages. A VCXO which has a relatively low cost (typically $800 to $3,000 for a high quality unit) has a life span of about twenty years and an accuracy of about 1 part in $10^{10}$ per day. Additionally, a VCXO suffers severe aging over its liftime which is directly related to the quality of the crystal used in the VCXO.

A rubidium clock has a high degree of accuracy in the order of 1 part in $10^{13}$ per day but its lifespan is only about ten years. Additionally, it has an initial cost of about $14,000.

A cesium clock, which is the most accurate clock available, provides an accuracy of 1 part in $10^{15}$ per day and is currently used as the primary time standard for the world. Although this clock suffers very little aging over its lifetime it will suddenly suffer extreme aging when the average five year lifespan ends. The significant cost of this clock, about $27,000, makes it unavailable for low cost systems which require high accuracy.

Cesium and rubidium clocks are both subject to local magnetic field variations and therefore they must be recalibrated against a primary time standard whenever they are moved or a change in a local magnetic field occurs.

Consequently, these clocks are not easily moved and provisions must be taken to prevent local magnetic field variations at their installation site.

Although the typical lifespan of cesium and rubidium clocks are five and ten years respectively the actual operational lifespan is much less. Both clocks utilize an immense quantity of highly complex electronics and therefore they are subject to malfunctions which are very difficult to rectify and usually require shipment of the clock to the factory for repairs. This repair time can be substantial resulting in an actual operational life much less than the clock life.

SUMMARY OF THE INVENTION

It is accordingly an object of the present invention to provide a low cost but highly accurate time standard.

It is a further object of the present invention to provide a time standard which is unaffected by aging.

It is a further object of the present invention to provide a time standard which can be used in radar applications to measure time intervals.

It is a further object of the present invention to provide a time standard which can be used to operate a constant frequency oscillator.

It is a further object of the present invention to provide a time standard which automatically compensates for temperature changes by utilizing fibers having predetermined indices of refraction and lengths.

It is still a further object of the present invention to provide a time standard which utilizes fibers with a metalized surface, through which an electric current is passed to compensate for any temperature changes.

In general, the invention features, in one aspect, apparatus for producing a time standard having, a source of radiation, and first and second fibers capable of transmitting the radiation. Each of the fibers has an input end and an output end with the input ends of both fibers being arranged to receive the radiation at substantially the same time. The first fiber has an index of refraction $N_1$ and a length $L_1$ and the second fiber has an index of refraction $N_2$ and a length $L_2$. The indices of refraction, $N_1$ and $N_2$, and the lengths, $L_1$ and $L_2$, are chosen so that the radiation propagates from the input end of the first fiber to the output end of the first fiber faster than the radiation propagates from the input end of the second fiber to the output end of the second fiber. The change in propagation time of the radiation transmitted by the first fiber from the input end of the first fiber to the output end of the first fiber due to a change in temperature substantially equals the change in propagation time of the radiation transmitted by the second fiber from the input end of the second fiber to the output end of the second fiber due to the change in temperature. The invention also features means for receiving the radiation emitted from the output end of the first and second fibers and producing a signal representative of the difference between the propagation time from the input of the first fiber to the output of the first fiber and the propagation time from the input of the second fiber to the output of the second fiber.

In preferred embodiments, the fibers are optical fibers; they are glass; the first fiber has a borosilicate core and claddings and the second fiber has a germania borosilicate core and silica claddings; the length of the second fiber is substantially twice the length of the first fiber; the source of radiation is a fast GaAs LED; a photodiode located adjacent to the output ends of the first and second fibers produces a first electric pulse when the radiation emerges from the output end of the first fiber and it produces a second electric pulse when the radiation emerges from the output end of the second fiber; bistable means which is placed in a first state by the first electric pulse and which is placed in a second state by the second electric pulse produces an output signal in dependence upon the instantaneous state.

In another aspect the invention features apparatus for producing a time standard having, a source of radiation, and first and second fibers capable of transmitting the radiation. Each of the fibers has an input end and an output end with the input ends of both fibers being arranged to receive the radiation at substantially the same time. The first fiber has a length $L_1$ and the second fiber has a length $L_2$. The lengths are chosen so that the radiation propagates from the input end of the first fiber to the output end of the first fiber faster than the radiation propagates from the input end of the second fiber to output end of the second fiber.

The first and second fibers are kept at substantially constant temperatures. The invention also features means for receiving the radiation emitted from the output ends of the first and second fibers and producing a signal representative of the difference between the propagation time from the input of the first fiber to the output of the first fiber and the propagation time from the input of the second fiber to the output of the second fiber.

In preferred embodiments, the outer surface of one of the fibers is metallized; an electric current passes through the metallized surface; the electric current varies in response to temperature changes and the temperature is adjusted in response to the changes in current.

This invention is one of the most significant advances in clocks in several decades because it provides a time standard with a cost comparable to the cost of a voltage controlled crystal oscillator but with an accuracy that approaches the accuracy of a rubidium clock. Additionally, the invention can be constructed of materials that age very little. Any aging that does occur is predictable and easily compensated for since the resulting change in the index of refraction due to any aging is linear.

The present invention provides a time standard that is more accurate than a VCXO but is less costly to manufacture. The lifespan is limited only by the life of the light source. The preferred embodiments uses a GaAs diode, with a lifespan of forty to fifty years, as a light source. Therefore, the present invention provides a time standard with at least double the lifespan of a VCXO and ten times the lifespan of a cesium clock.

Future advances may provide light sources with lifespans in excess of fifty years and this will increase the lifespan of the time standard in the present invention accordingly.

The time standard of the present invention utilizes a simple design which results in low cost, a long operational life, and high reliability because there are few parts to fail. This allows easy on-site repair should a failure occur and a resulting decrease in lost operating time as compared to cesium or rubidium clocks which must be returned to the factory for repairs.

The time standard of the present invention can be packaged much smaller than a cesium or a rubidium clock and because it is unaffected by local magnetic field variations it can be easily moved.

Other features and advantages of the invention will be apparent from the following description of the preferred embodiments, and from the claims.

For a full understanding of the present invention, reference should now be made to the following detailed description of preferred embodiments of the invention and to the accompanying drawings.

DESCRIPTION OF THE PREFERRED EMBODIMENTS

A preferred embodiment of the invention will now be described with reference to FIGS. 1 to 3 of the drawings.

Figure 1:
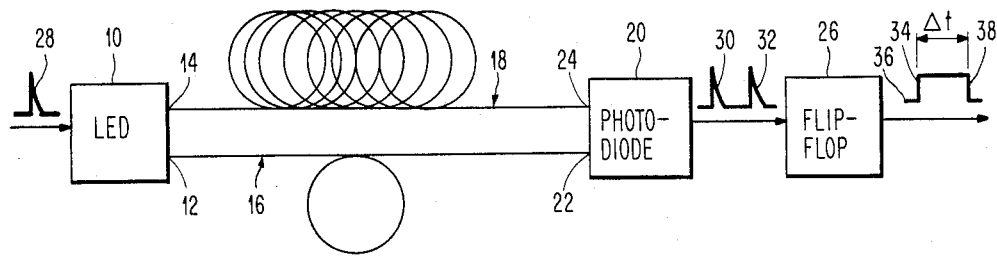
FIG. 1 is a diagrammatic view of preferred embodiments.

Referring to FIG. 1, the fiber optic time standard has a fast GaAs light emitting diode (LED) 10 located adjacent to the input ends of the optical fibers 12, 14.

The shorter optical fiber 16, has a borosilicate ($B_2O_3$-$SiO_2$) core and cladding. The longer optical fiber 18, which has a length equal to approximately twice the length of the shorter fiber, has a germania borosilicate ($GeO_2$-$B_2O_2SiO_2$) core and silica ($SiO_2$) cladding.

Positive intrinsic negative avalanche photodiode 20, located adjacent to the output ends 22, 24 of the optical fibers, is connected to an ECL, JK flip-flop 26.

In operation of the apparatus of FIG. 1, a sharp electric pulse 28, is delivered to the input of LED 10 and a resulting pulse of light is emitted simultaneously into both optical fibers. Due to the different lengths of the optical fibers the light pulse arrives at the output end 22 of the shorter fiber first. This light pulse then activates photodiode 20 which produces an electrical signal 30. The light pulse then arrives at output end 24 of the longer fiber and activates the photodiode a second time to produce a second electrical signal 32.

The first electrical signal 30 is fed from the photodiode to the flip-flop and it switches the flip-flop output to a high output signal 34 as opposed to the low level output 36 normally produced. The second electrical signal 32 is also fed from the photodiode to the flip-flop and it switches the flip-flop from the high output signal 34 back to the low level output signal 36. The result is a rectangular wave signal 38 with a period $\Delta t$, which equals the difference in time between the light pulse reaching the output end of the shorter fiber and the output end of the longer fiber.

The critical parameters of this system are the lengths and indices of refraction of the two optical fibers.

Figure 2:
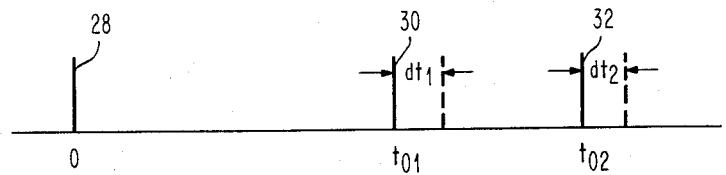
FIG. 2 shows the relationship between the time period $\Delta t$ and temperature changes in said preferred embodiments of FIG. 1.

Referring to FIG. 2, if $\Delta t$ equals the difference in time between the light pulse reaching the output end of the shorter fiber and the output end of the longer fiber then, $$\Delta t = (t_{01} + dt_1) - (t_{02} + dt_2)$$

where:

$t_{01}$ = propagation time of the light pulse from the input to the output end of the shorter fiber at some reference temperature $T_0$.

$t_{02}$ = propagation time of the light pulse from the input to the output end of the longer fiber at reference temperature $T_0$.

$dt_1$ = change in propagation time from the input to the output end of the shorter fiber due to a change in temperature.

$dt_2$ = change in propagation time from the input to the output end of the longer fiber due to a change in temperature.

$t_{01}$ and $t_{02}$ are constants so $\Delta t$ is dependent upon $dt_1$ and $dt_2$. To produce a time constant, $\Delta t$, which does not vary with temperature $dt_1$ must equal $dt_2$.

$$dt_1 = f(T_1, N_1, L_1)$$

$$dt_2 = f(T_2, N_2, L_2)$$

where:

$T_1$ = temperature of the shorter fiber
$T_2$ = temperature of the longer fiber
$N_1$ = index of refraction of the shorter fiber
$N_2$ = index of refraction of the longer fiber
$L_1$ = length of the shorter fiber
$L_2$ = length of the longer fiber However, $T_1$ equals $T_2$ so dt for each fiber is only a function of the respective index of refraction, which is a constant determined by the fiber material, and the respective fiber length.

Figure 3:
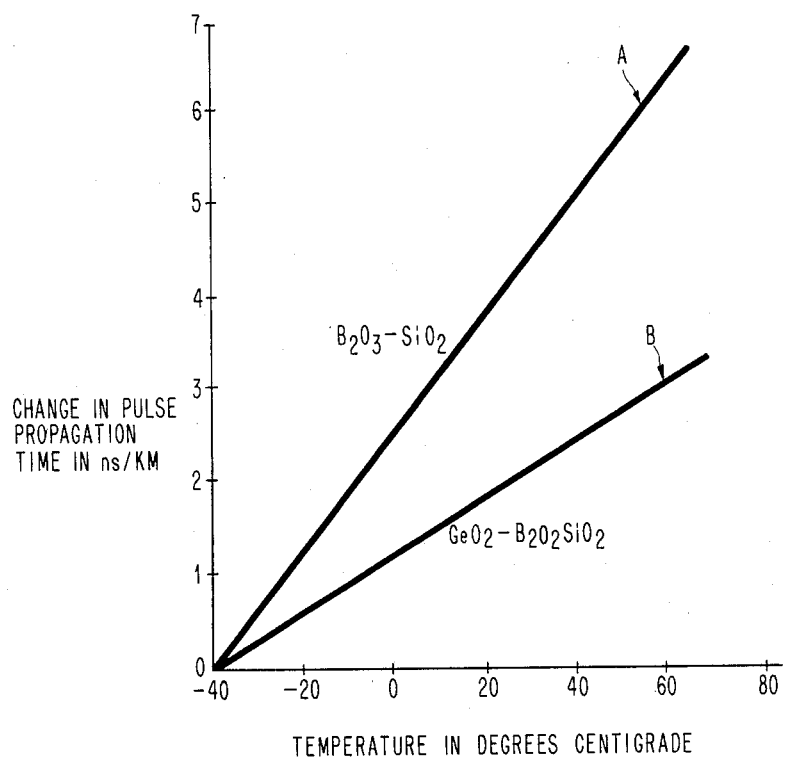
FIG. 3 shows the change in pulse propagation time (ns/km) versus temperature changes (°C.) for the optical fibers shown in FIG. 1.

Referring to FIG. 3, a diagram of $dt_1$ and $dt_2$ versus temperature is shown (Ref. letter A refers to the shorter fiber and Ref. letter B refers to the longer fiber). These linear relationships were determined experimentally by L. G. Cohen and J. W. Flemming and reported in "Effect of Temperature on Transmission in Lightguides", *The Bell System Technical Journal,* Volume 58, No. 4, April 1979.

By choosing optical fibers with different indices of refraction the relative lengths of the fibers can be determined to the slopes of the fiber curves, shown in FIG. 3, are equal with the result that $dt_1$ equals $dt_2$. The slope of each fiber curve is a function of the change in pulse propagation time, which is dependent on fiber length. An increase in fiber length results in an increase in the change of pulse propagation time for a given temperature increase. As a result the following relationship exists between slope and fiber length:

$$\frac{m_1}{m_2} = \frac{L_2}{L_1}$$

where:
 $m_1$ = slope of fiber curve A in FIG. 3
 $m_2$ = slope of fiber curve B in FIG. 3

In the preferred embodiment the shorter fiber is represented by fiber curve A and the longer fiber is represented by fiber curve B. Once $m_1$ and $m_2$ are determined the respective lengths of the shorter and longer fibers can be calculated. Actual measurements of dt per °C. in the Bell System Technical Journal article already discussed, is as follows:
 65 PS/KM/°C. for the shorter fiber
 33 PS/KM/°C. for the longer fiber Therefore, 65/33 equals $L_2/L_1$ and any lengths $L_1$ and $L_2$ which satisfy this relationship will provide a $\Delta t$ that is constant despite temperature changes.

The absolute lengths of the two fibers will be a matter of design choice which will depend upon the time period $\Delta t$ that is desired for the system. For example if a $\Delta t$ of 50 ns is desired in a system with an absolute index of refraction for the two fibers of 1.4, $L_1$ and $L_2$ can be determined as follows:

$$N = c/s$$

where:
 N = absolute index of refraction of the fibers
 C = speed of light in a vacuum
 S = speed of light in the fibers $$1.4 = \frac{3 \times 10^8 \, M/sec}{S}$$

$$S = .214 \, M/ns$$

The difference in length between $L_1$ and $L_2$ equals S times the desired $\Delta t$. Therefore, the difference in length is 0.214 M/ns multiplied by 50 ns which equals 10.7 meters. The result is $L_1$ equal to 10 meters and $L_2$ equal to 20.7 meters for a $\Delta t$ of 50 ns.

Other embodiments are within the following claims e.g., an alternate embodiment of the invention will now be described with reference to FIGS. 4 and 5 of the drawings.

Figure 4:
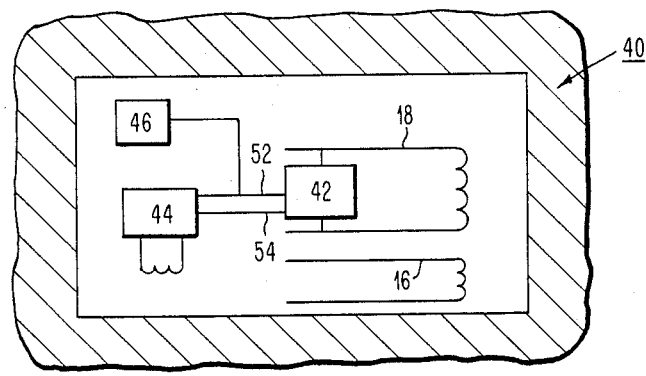
FIG. 4 is a diagrammatic view of an alternate embodiments.

Referring to FIG. 4, the fibers 16, 18 are placed in an oven, and the outer surface of one of the fibers 18 is metallized. The metallized surface is attached, at the fiber ends, to a control 42, which is connected to a variable heater 44. Power supply 46 is connected to the variable heater and the control.

Figure 5:
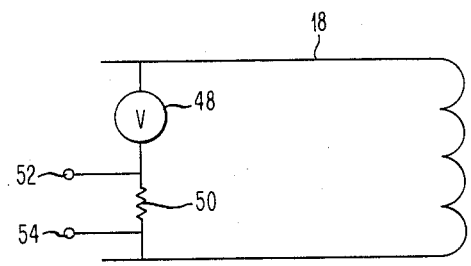
FIG. 5 is a diagrammatic view of the control circuit of said alternate embodiment.

In operation of the apparatus of FIG. 4, control 42 (which is shown in more detail in FIG. 5( has a voltage source 48 which provides an electric current in the metallized surface of fiber 18. Any change in temperature will cause a change in the length and resistance of the metalized surface of fiber 18 which will result in a change in the current flowing through the metallized fiber surface. This current change is detected across resistance 50 and fed into the heater via lines 52, 54. In response to the current changes the heater will be operated to maintain the temperature at a constant level.

There has thus been shown and described novel apparatus for producing a time standard which fulfills all the objects and advantages sought therefore. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. Apparatus for producing a time standard comprising:
   (a) a source of radiation;
   (b) first and second fibers capable of transmitting said radiation;
     (1) each of said fibers having an input end and an output end, said input end of said first fiber and said input end of said second fiber being arranged to receive said radiation from said source at substantially the same time,
     (2) said first fiber having an index of refraction $N_1$, and length $L_1$, said second fiber having an index of refraction $N_2$ and length $L_2$, said indices of refraction $N_1$ and $N_2$ and said lengths $L_1$ and $L_2$ being chosen such that said radiation propagates from said input end of said first fiber to said output end of said first fiber faster than said radiation propagates from said input end of said second fiber to said output end of said second fiber, and the change in propagation time of said radiation transmitted by said first fiber from said input end of said first fiber to said output end of said first fiber due to a change in temperature substantially equals the change in propagation time of said radiation transmitted by said second fiber from said input end of said second fiber to said output end of said second fiber due to said change in temperature, and
   (c) means for receiving the radiation emitted from said output ends of said first and said second fibers and producing a signal representative of the difference between said propagation time from said input of said first fiber to said output of said first fiber and said propagation time from said input of said second fiber to said output of said second fiber.

2. Apparatus for producing a time standard comprising:
   (a) a source of radiation;
   (b) first and second fibers capable of transmitting said radiation,
     (1) each of said fibers having an input end and an output end, said input end of said first fiber and said input end of said second fiber being arranged to receive said radiation from said source at substantially the same time, (2) said first fiber having a length $L_1$ and said second fiber having a length $L_2$, said lengths being chosen such that radiation propagates from said input end of said first fiber to said output end of said first fiber faster than said radiation propagates from said input end of said second fiber to said output end of said second fiber, (c) means to maintain said first fiber and said second fiber at substantially constant temperatures, and, (d) means for receiving the radiation emitted from said output ends of said first and said second fibers and producing a signal representative of the difference between said propagation time from said input of said first fiber to said output of said first fiber and said propagation time from said input of said second fiber to said output of said second fiber.

3. The apparatus of claim 2 wherein said means to maintain said first fiber and said second fiber at a constant temperature comprises, (a) metallization on the outer surface of at least one of said first fiber and said second fiber, (b) means for electrically energizing said metallization, thereby to pass an electric current along said surface of said at least one fiber from one end thereof to the other, (c) means responsive to said electric current for adjusting the temperature surrounding said first and second fibers to maintain said temperature constant.

4. The apparatus of claim 1 or 2 wherein said fibers are optical fibers.

5. The apparatus of claim 1 and 2 wherein said fibers are glass.

6. The apparatus of claim 1 or 2 wherein said first fiber is an optical glass fiber with a borosilicate core and cladding, and said second fiber is an optical glass fiber with a germania borosilicate core and silica cladding.

7. The apparatus of claim 1 wherein said length $L_2$ is substantially twice said length $L_1$.

8. The apparatus of claim 1 or 2 wherein said source of radiation is a fast GaAs LED.

9. The apparatus of claim 1 or 2 wherein said means for receiving the radiation emitted from said output ends of said first and said second fibers and producing a signal representative of the difference between said propagation time from said input of said first fiber to said output of said first fiber and said propagation time from said input of said second fiber to said output of said second fiber comprises, (a) a photodiode located adjacent to said output ends of said first and second fibers, said photodiode producing a first electric pulse when said radiation emerges from said output end of said first fiber, and said photodiode producing a second electric pulse when said radiation emerges from said output end of said second fiber, and (b) bistable means coupled to said photodiode and having two stable states, said bistable means being placed in a first state by said first pulse and being placed in a second state by said second pulse and producing an output signal in dependence upon the instantaneous state.

* * * * *